United States Patent [19]
Alsmeier et al.

[11] Patent Number: 5,937,288
[45] Date of Patent: Aug. 10, 1999

[54] CMOS INTEGRATED CIRCUITS WITH REDUCED SUBSTRATE DEFECTS

[75] Inventors: Johann Alsmeier, Wappinger Falls, N.Y.; Klaus Wangemann, Glen Allen, Va.

[73] Assignee: Siemens Aktiengesellschaft, Munich, Germany

[21] Appl. No.: 08/884,860

[22] Filed: Jun. 30, 1997

[51] Int. Cl.⁶ .......................... H01L 21/306; H01L 21/76
[52] U.S. Cl. .......................... 438/221; 257/301; 156/648; 438/207; 438/433
[58] Field of Search ................................... 438/207, 425, 438/427, 430, 433, 524, 221; 257/301; 156/648

[56] References Cited

U.S. PATENT DOCUMENTS

| | | | |
|---|---|---|---|
| 4,495,025 | 1/1985 | Haskell | 156/648 |
| 4,653,177 | 3/1987 | Lebowitz et al. | 438/221 |
| 5,298,450 | 3/1994 | Verret | 438/221 |
| 5,675,176 | 10/1997 | Ushiku et al. | 257/617 |
| 5,691,550 | 11/1997 | Kohyama | 257/301 |
| 5,698,878 | 12/1997 | Miyashita et al. | 257/301 |

FOREIGN PATENT DOCUMENTS

| | | |
|---|---|---|
| 0 694 976 | 1/1996 | European Pat. Off. . |
| 0 720 218 | 7/1996 | European Pat. Off. . |
| 2-161730 | 6/1990 | Japan . |
| 8-139177 | 5/1996 | Japan . |

OTHER PUBLICATIONS

S. Wolf Silicin Processing for the VSLI ERA Lattice press pp. 600–603, 606–607,665 1990.

*Primary Examiner*—Charles Bowers
*Assistant Examiner*—David S Blum
*Attorney, Agent, or Firm*—Stanton C. Braden

[57] ABSTRACT

A complementary metal oxide (CMOS) integrated circuit configured for reducing the formation of silicon defects in its silicon substrate during manufacture. The silicon defects are formed from silicon interstitials present in the silicon substrate. The CMOS integrated circuit includes a deep implantation region formed within the silicon substrate. There is further included at least one vertical trench formed in the silicon substrate. The trench is formed such that at least a portion of the trench penetrates into the deep implantation region of the silicon substrate to present vertical surfaces within the deep implantation region, thereby allowing the silicon interstitials to recombine at the vertical surfaces.

14 Claims, 2 Drawing Sheets

CMOS INTEGRATED CIRCUITS WITH REDUCED SUBSTRATE DEFECTS

BACKGROUND OF THE INVENTION

The present invention relates generally to the manufacture of CMOS integrated circuits (ICs). More specifically, the invention relates to a method of manufacturing CMOS integrated circuits on a silicon substrate which includes a high dose deep implant in the substrate for reducing the problem of latch-up of the IC.

One of the ongoing problems associated with CMOS integrated circuits, particularly modern dynamic random access memory (DRAM) circuits, is their sensitivity to latch-up. This problem is well known in the art and is described in, for example, R. Troutman, "*Latch-up in CMOS Technology: The Problem and Its Cure.*" Kluwer Academic, Norwell, Mass. (1986) In this reference, a high dose deep implant is used in the silicon substrate in order to reduce the latch-up problem. Generally, the higher the implant dosage, the lower the sensitivity to latch-up. However, as the dosage of the implant dopant is increased, a new problem is created. This problem is a result of the formation of defects, such as dipoles, in the substrate during the implanting process and subsequent anneal and oxidation process steps of the manufacture of the integrated circuit.

To facilitate discussion of the silicon defect problem, FIG. 1 illustrates a partial cross sectional view of a typical prior art CMOS integrated circuit silicon substrate 100 shown here at a particular point during the manufacture of the integrated circuit. Substrate 100 includes a high dose deep boron implantation region 102 (having a dose range of, for example, about 1E13–1E15 Ions/cm$^2$) which has been formed in a previous process step. The deep boron implant process is well known in the art and therefore will not be described further herein. Although boron is used in this example as the dopant material, other dopants such as phosphorous and arsenic may be used rather than boron as is known in the art.

As shown in FIG. 1, substrate 100 has a typical CMOS IC configuration with a gate stack formed over junctions which are formed in associated P and N wells using well known IC processing techniques. Although the substrate illustrated has a particular configuration of elements formed on the substrate, the problem of the formation of dipoles in the substrate during the manufacture of the IC is a general problem associated with CMOS IC manufacturing when a high dose deep implant is used to reduce the sensitivity of the IC to latch-up regardless of the specific configuration of the elements formed on the substrate.

In the example illustrated in FIG. 1, a P-well 104 and an N-well 106 are formed into substrate 100. Also, heavily doped n-type (N+) junctions 108 and 110 are formed over P-well 104 and heavily doped p-type (P+) junctions 112 and 114 are formed over N-well 106, which are self-aligned to the gate stack. A shallow trench isolation (STI) oxide 116 is formed to separate and isolate the N+ and P+ junctions. Gate stacks 118 are formed on substrate 100. As is known in the art, gate stack 118 may be made up of a variety of different layers such as a polysilicon layer 120, a silicide layer, and/or a nitride layer 122.

As described above, a high dose deep implant is formed within substrate 100 which is used to reduce the sensitivity of the IC to latch-up. The dopant may be boron, phosphorous, arsenic, or any other conventional dopant material. As also mentioned above, generally, the higher the implant dose the lower the sensitivity to latch-up. However, once the dosage is increased above a certain critical level, the implantation process along with subsequent process steps in the manufacture of the integrated circuit causes the formation of dipoles or defects in the substrate. These dipoles or defects are illustrated in FIG. 1 by parallel lines 124, 126, and 128.

Dipoles 124, 126, and 128 are formed by the presence within the substrate of interstitials and vacancies which are not able to migrate to the surface of the silicon substrate. The substrate surface is indicated by surface 130 in FIG. 1. The interstitials are believed to be free silicon atoms which are not connected in the crystal lattice of the silicon substrate. These interstitials are released from the silicon lattice during the deep implantation process leaving behind vacancies in the silicon crystal. Generally, as long as the dose of the deep implantation is maintained below a critical dose (which is dependent on the depth of the deep implantation and the dopant used for the implantation), the interstitials and vacancies are able to migrate to surface 130 of the silicon substrate where they annihilate effectively during the various heat cycles of the manufacturing of the IC. If this is the case, the dipoles are not formed in the substrate. However, once the dosage is increased above the critical dose, all of the interstitials and vacancies are not able to either recombine or to migrate to the surface of the silicon substrate where they annihilate effectively. This leads to the formation of dipoles such as dipoles 124, 126, and 128.

As illustrated in FIG. 1, the dipoles are formed in a random manner. In some cases, a dipole such as dipole 128 may intersect a junction or other element formed on substrate 100 (as illustrated by dipole 128 intersecting junction 112 in FIG. 1). If this occurs, the dipole may cause electrical effects that can cause a failure in the IC. For example, dipole 128 may cause junction leakage from junction 112, which pulls down the potential of the junction to an incorrect level during the operation of the IC. This type of junction leakage and other electrical effects caused by dipoles may result in the unreliable operation of the IC thereby reducing the yields of IC's manufactured using high dose deep implantation substrates.

Because of the above described dipole problem, IC's manufactured using high dose deep implantation substrates typically use deep implants which limit the deep implant dosage to no greater than the critical dosage described above. In the specific example of a deep boron implant which is implanted at a depth of approximately 1–2 microns below the surface of the substrate, the critical dosage is typically about 8E$^{13}$ Ions/cm$^2$. Similarly, critical dosages for other specific deep implant substrate configurations using other dopants implanted at different depths would have critical dosages dependent on the dopant and the depth of implantation.

In order to further reduce the problem of sensitivity to latch-up, it is desirable to be able to increase the dosage above the critical dosages described above. In one approach, an additional annealing step is added to the process to reduce the probability of forming dipoles when high dose deep implant substrates are used. FIG. 2 illustrates a silicon substrate 200 similar to the substrate of FIG. 1 in that substrate 200 has the same elements as substrate 100. These elements include deep boron implant 102, P-well 104, N-well 106, N+ junctions 108 and 110, P+ junctions 112 and 114, STI oxide 116, and gate stacks 118. However, substrate 200 has been manufactured using a process which includes an additional annealing step performed after the deep boron implantation step. This annealing step involves heating the substrate for a period of time in order to allow more of the interstitials and vacancies formed during the deep implantation to migrate to the surface of the substrate where they are annihilated.

As illustrated in FIG. 2 by dipoles 202, 204, and 206, the annealing process tends to break up or reduce the formation of large dipoles. This reduces the probability that one of the dipoles, such as dipole 206 of FIG. 2, will create a strong enough electrical effect, such as junction leakage, to cause the failure of the IC. However, dipoles are still formed in the substrate and therefore may still cause defects in the IC. The annealing process simply reduces by some measure the probability of a dipole causing a failure of the IC.

In still another approach to reducing the latch-up problem, a more expensive P+ and P− substrate is used. These more expensive substrates allow the use of higher concentrations of dopant before the IC processing starts. However, in addition to the added expense of this type of substrate, this approach is limited to certain IC processes only.

Therefore, in order to further reduce the sensitivity of CMOS IC (such as DRAM circuit) to latch-up, it is desirable to be able to use higher dose deep implanting if the problem of forming dipoles within the substrate could be overcome. The present invention provides a method of producing a CMOS integrated circuit which reduces the probability that dipoles will be formed in a high dose deep implant substrate during the manufacture of the integrated circuit. This allows a higher dose deep implant to be used and therefore reduces the sensitivity to latch-up for IC's produced using this novel method.

SUMMARY OF THE INVENTION

The present invention relates, in one embodiment, to a method for reducing the formation of silicon defects in a silicon substrate during the manufacture of a complementary metal oxide (CMOS) integrated circuit. The silicon defects are formed from silicon interstitials present in the silicon substrate. The method includes providing the silicon substrate in a substrate processing chamber. The silicon substrate has a deep implantation region therein. The method further includes forming a plurality of vertical trenches into the silicon substrate, at least a portion of the vertical trenches penetrates into the deep implantation region of the silicon substrate to present vertical surfaces within the deep implantation region, thereby allowing the silicon interstitials to recombine at the vertical surfaces.

In another embodiment, the invention relates to a complementary metal oxide (CMOS) integrated circuit configured for reducing the formation of silicon defects in its silicon substrate during manufacture. The silicon defects are formed from silicon interstitials present in the silicon substrate. The CMOS integrated circuit includes a deep implantation region formed within the silicon substrate. There is further included at least one vertical trench formed in the silicon substrate. The trench is formed such that at least a portion of the trench penetrates into the deep implantation region of the silicon substrate to present vertical surfaces within the deep implantation region, thereby allowing the silicon interstitials to recombine at the vertical surfaces.

These and other features of the present invention will be described in more detail below in the detailed description of the invention and in conjunction with the following figures.

BRIEF DESCRIPTION OF THE DRAWINGS

The features of the present invention may best be understood by reference to the following description of the presently preferred embodiments together with the accompanying drawings.

DETAILED DESCRIPTION OF THE INVENTION

An invention is herein described for providing methods for manufacturing a CMOS IC using high dose deep implant substrates. The method allows implant dosages higher than the critical dosages described above in the background while reducing or eliminating the formation of silicon defects, including dipoles, within the substrate.

In the following description, numerous specific details are set forth in order to provide a thorough understanding of the present invention. However, in view of this description, it will be obvious to one skilled in the art that the present invention may be embodied in a wide variety of specific configurations. Also, well known integrated circuit manufacturing processes such as processes used to deposit various layers of material on a silicon substrate, etching processes, and other such conventional integrated circuit manufacturing processes will not be described in detail in order not to unnecessarily obscure the present invention.

For illustrative purposes, the present invention will be described using the example of a deep implant silicon substrate similar to substrate 100 described above. Although this example shows specific elements positioned at specific locations, it should be understood that the present invention is not limited to this specific configuration. Instead, the present invention would equally apply to any CMOS IC which includes the use of a deep implant region regardless of the specific configuration of the various features or elements formed onto the substrate.

Figure 3:
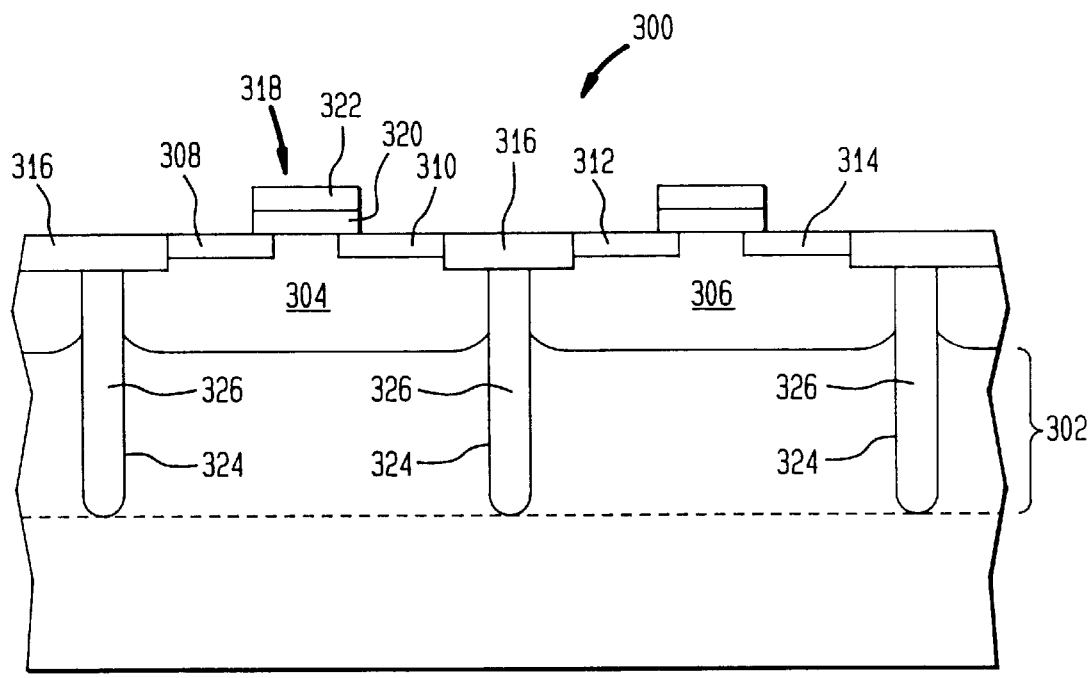
FIG. 3 is a diagrammatic partial cross-sectional view of one embodiment of a CMOS IC manufactured in accordance with the present invention.

Referring now to FIG. 3, a silicon substrate 300 used to produce a CMOS IC manufactured using one embodiment of a method in accordance with one embodiment of the present invention will initially be described. FIG. 3 illustrates a diagrammatic partial cross-sectional view of substrate 300 shown here at a particular point during the manufacture of the integrated circuit after gate stacks have been formed on the substrate. For this embodiment and in a similar manner as described above for substrate 100, substrate 300 includes a high dose deep implant region 302 which is formed using a conventional deep implant process. However, in substrate 300, the deep implant is not limited to the critical doses described above. Instead, because of subsequent process steps to be described hereinafter, the dosage of the implant may be substantially greater than the critical dosage without causing the dipole problems described above. The dopant used to form deep implant region 302 may be any conventional dopant. These conventional dopants may include, for example, boron, phosphorous, arsenic, and/or any other known dopants.

Figure 1:
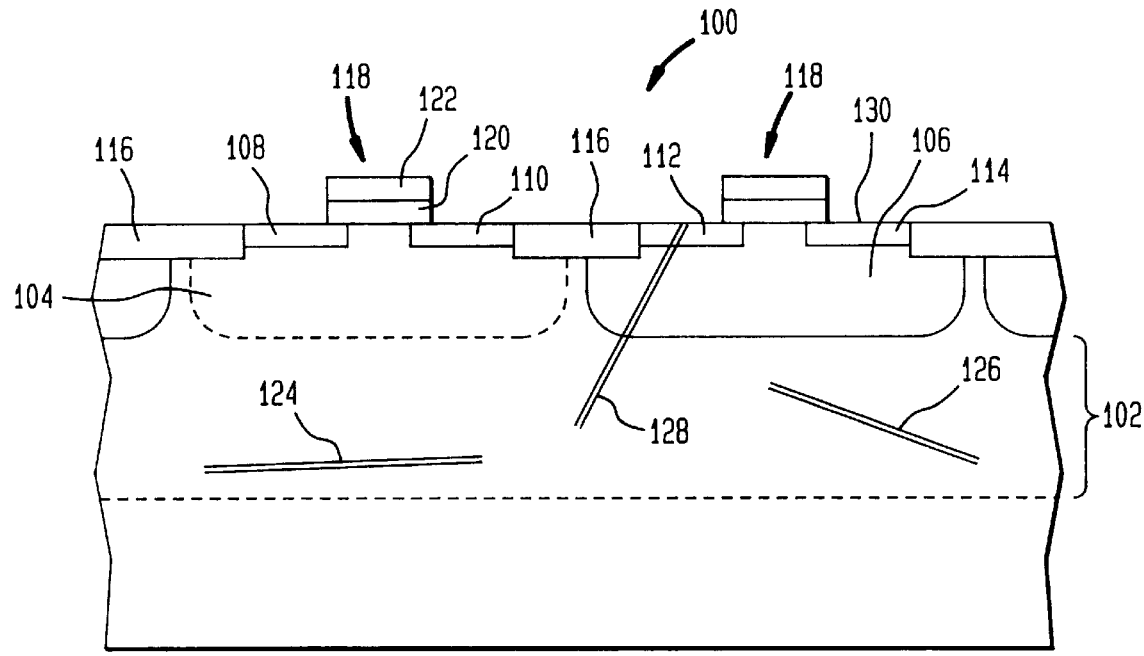
FIG. 1 is a diagrammatic partial cross-sectional view of a prior art CMOS IC including a deep boron implant.
Figure 2:
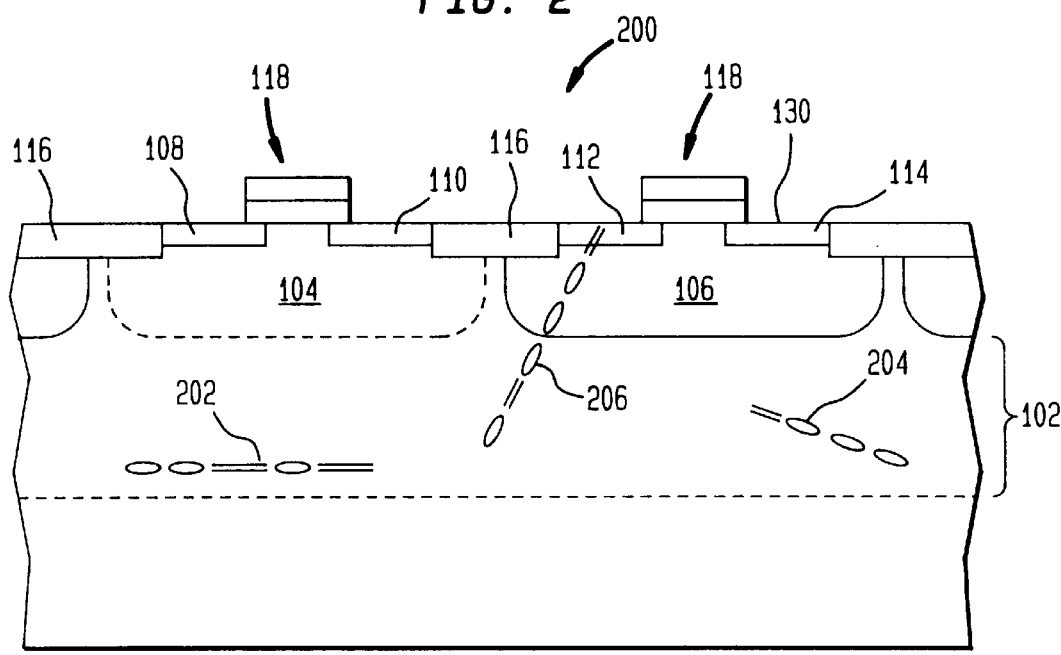
FIGS. 2 is a diagrammatic partial cross-sectional view of another embodiment of a prior art CMOS IC including a deep boron implant which has been annealed during the manufacturing process.

For illustrative purposes, substrate 300 is shown in FIG. 3 as having a typical CMOS IC configuration with a gate stack formed over junctions which are formed in associated P and N wells as described above for FIG. 1. For this example, a P-well 304 and an N-well 306 are formed into substrate 300. N+ junctions 308 and 310 are formed over P-well 304 and P+ junctions 312 and 314 are formed over N-well 106 as was described above for substrate 100. Substrate 300 similarly includes STI oxide portions 316 which separate and isolate the N+ junctions and P+ junctions. As is known in the art, gate stack 318 may be made up of a variety of different layers such as a polysilicon layer 320, a silicide layer, and/or a nitride layer 322.

Substrate 300 differs from substrate 100 in one very significant way. In accordance with one embodiment of the present invention, substrate 300 further includes deep trenches 324 formed into substrate 300. In this embodiment, deep trenches 324 are formed into substrate 300 before STI oxide portions 316 are preferably formed. Deep trenches 324 are preferably formed below the locations on which STI oxide portions 316 are to be formed and between each successive P and N well.

Deep trenches 324 may be formed using any known deep trench etching technique. Generally, deep trenches 324 should extend down into substrate 300 such that the trenches at least touch deep implant region 302. Preferably, deep trenches 324 extend all the way through deep implant region 302 as illustrated in FIG. 3. In one embodiment, the trenches may have a maximum distance of about 2–5 microns, depending on the dose of the implant.

Once deep trenches 324 are formed into substrate 300, interstitial-and vacancy recombining surfaces are created at the sidewalls of the vertical trenches. After deep trenches 324 are formed, a material 326 is deposited into the vertical trenches. In the embodiment shown in FIG. 3, material 326 takes the form of an oxide material that substantially fills deep trench 324. This oxide material is deposited within deep trenches 324 using any conventional oxide depositing process.

Figure 4:
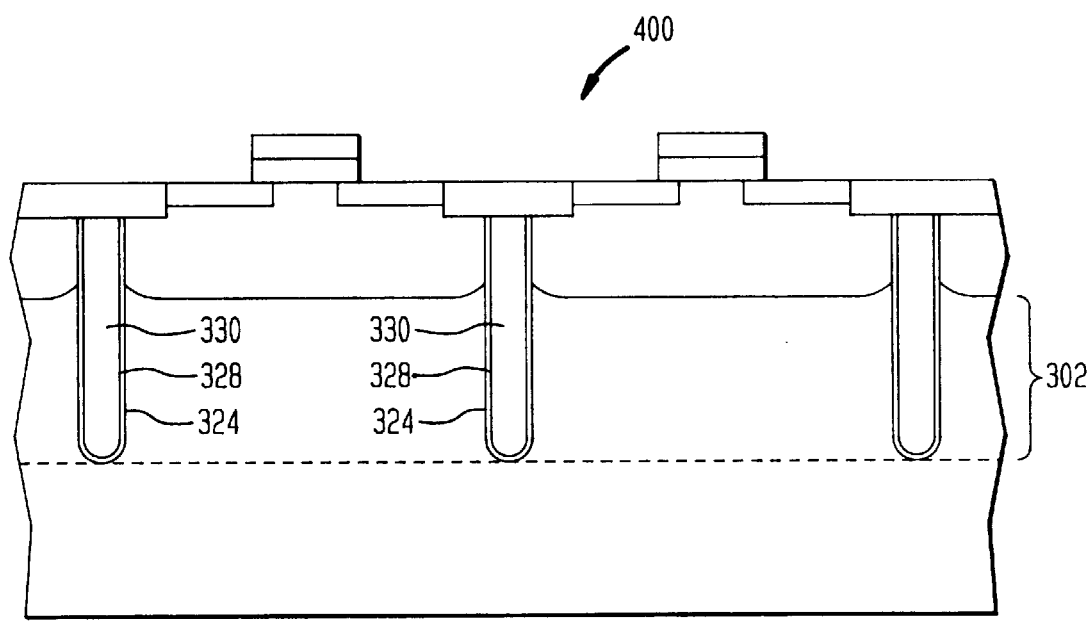
FIG. 4 is a diagrammatic partial cross-sectional view of a second embodiment of a CMOS IC manufactured in accordance with the present invention.

FIG. 4 illustrates another embodiment of a substrate 400 that is similar to substrate 300 and which is manufactured in accordance with one embodiment of the present invention. In this embodiment, a different material is used to fill deep trenches 324. As illustrated in FIG. 4, once deep trenches 324 are formed, a thin dielectric layer 328 is formed using known depositing techniques over the surfaces of the vertical trenches. Then, vertical trenches 324 are filled with a polysilicon material 330 again using conventional processing techniques.

In one particular example of a CMOS IC designed in accordance with one embodiment of the present invention using a 0.25 micron design rule, deep trenches 324 may be 0.25 microns wide. Assuming that the deep implant region is located in the region from about 1 to about 2 microns below the surface of the substrate, an appropriate spacing for the trenches might be about 2 to 3 microns. Although this specific example of trench size and spacing has been given, the present invention is not limited to these specific dimensions or these specific ratios of dimensions. Instead, the present invention would equally apply regardless of the trench width and spacing so long as trenches are formed into the substrate and then filled with a material capable of recombining at the surfaces of the interstitials. In some cases, this material may be any conventional material used in IC manufacturing.

In the cases of both substrate 300 and substrate 400 and in accordance with one embodiment of the present invention, deep trenches 324 and the material filling the trenches provide substantially increased vertical surface areas for the interstitials created during the processing of the substrate to migrate to and recombine. This substantially reduces the presence of interstitials within the deep implant region and therefore substantially reduces or eliminates the formation of silicon defects (including dipoles) in the substrate when compared to the above described prior art substrate 100 of FIG. 1. This is true even if the dosage of the deep implant dopant is substantially higher than the critical dose described above in the background.

This novel process of forming deep trenches and vertical interfaces leading to recombination of interstitials provides the advantage of allowing deep implants which use deep implant dosages much higher than the critical doses described above in the background without causing the problem of forming dipoles. By using these higher dose implants, the sensitivity of a CMOS IC manufactured using this process may be substantially reduced.

In one embodiment ,the novel silicon defect reduction technique may be applied to random access memory (RAM) circuits, such as dynamic RAMs (DRAMs), synchronous DRAMs (SDRAMs), or static RAMs (SRAMs). In some cases, the deep trenches may be disposed outside of the memory array area (e.g., away from area where the array of capacitors is disposed) to facilitate reduction of silicon defects in these areas.

Although only two specific embodiments of methods in accordance with one embodiment of the present invention have been described above in detail, it is to be understood that the methods of the present invention may be embodied in a wide variety of alternative forms and still remain within the scope of the invention. Any of these various embodiments would equally fall within the scope of the invention so long as trenches are formed into the substrate, forming vertical interfaces that are capable of recombining with interstitials. Also, although the various embodiments have been described as including various elements formed on the substrate other than the trenches with the various elements having particular respective orientations, it should be understood that the present invention may take on a wide variety of specific configurations incorporating a wide variety of elements formed on the substrate with the various elements being located in a wide variety of positions and mutual orientations and still remain within the scope of the present invention. Therefore, the present examples are to be considered as illustrative and not restrictive, and the invention is not to be limited to the details given herein, but may be modified within the scope of the appended claims.

What is claimed is:

1. A method for reducing the formation of silicon defects in a silicon substrate during the manufacturing of a complementary metal oxide (CMOS) integrated circuit, the silicon defects being formed from silicon interstitials present in the silicon substrate, said method comprising;

providing the silicon substrate in a substrate processing chamber;

forming a deep implantation region in said substrate; and forming a plurality of vertical trenches into the silicon substrate, wherein at least a portion of the vertical trenches penetrates into the deep implantation region of the silicon substrate to present vertical surfaces within the deep implantation region, thereby allowing the silicon interstitials to recombine at the vertical surfaces.

2. The method of claim 1 wherein the vertical trenches are disposed below shallow trench isolation regions of the integrated circuit.

3. The method of claiming further comprising:

forming a thin dielectric layer over the surface within the vertical trenches; and filling the vertical trenches with polysilicon.

4. The method of claim 1 wherein the trench extends at least entirely through the deep implantation region.

5. The method of claim 1 wherein the deep implantation region is a deep boron implantation region.

6. The method of claim 1 wherein the deep implantation region is a deep phosphorous implantation region.

7. The method of claim 1 wherein the deep implantation region is a deep arsenic implantation region.

8. The method of claim 1 wherein the CMOS integrated circuit represents a dynamic random access memory (DRAM) circuit.

9. The method of claim 8 wherein the vertical trenches are formed outside of memory array areas of the DRAM circuit.

10. The method of claim 1 wherein the silicon defects are dipoles.

11. The method of claim 1 further comprising:

filling the vertical trenches with oxide material.

12. The method of claim 1 wherein said deep implantation region is formed by deeply implanting a high dose of dopant in said substrate.

13. A method for reducing the formation of silicon defects in a silicon substrate during the manufacture of a dynamic random access memory (DRAM) circuit, the silicon defects being formed from silicon interstitials present in the silicon substrate of the DRAM circuit, the silicon substrate having a deep implantation region therein, comprising:

providing the silicon substrate in a substrate processing chamber, the silicon substrate having a deep implantation region therein; and forming a plurality of vertical trenches into the silicon substrate, the plurality of trenches being disposed outside of memory array areas of the DRAM, at least a portion of the vertical trenches penetrates into the deep implantation region of the silicon substrate to present vertical surfaces within the deep implantation region, thereby allowing the silicon interstitials to recombine at the vertical surfaces.

14. The method of claim 13 wherein the vertical trenches are formed below shallow trench isolation (STI) oxide regions.

* * * * *